(12) United States Patent
Chi et al.

(10) Patent No.: US 12,125,829 B2
(45) Date of Patent: Oct. 22, 2024

(54) ELECTRONIC DEVICE

(71) Applicant: InnoLux Corporation, Miao-Li County (TW)

(72) Inventors: Jen-Hai Chi, Miao-Li County (TW); Chia-Ping Tseng, Miao-Li County (TW); Chen-Lin Yeh, Miao-Li County (TW); Yan-Zheng Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/093,331

(22) Filed: Jan. 5, 2023

(65) Prior Publication Data

US 2023/0154900 A1 May 18, 2023

Related U.S. Application Data

(63) Continuation of application No. 17/106,197, filed on Nov. 30, 2020, now Pat. No. 11,574,893.

(30) Foreign Application Priority Data

Oct. 20, 2020 (CN) .......................... 202011127548.4

(51) Int. Cl.
*H01L 23/00* (2006.01)
*H01L 23/31* (2006.01)
(Continued)

(52) U.S. Cl.
CPC ........ *H01L 25/072* (2013.01); *H01L 23/3121* (2013.01); *H01L 23/481* (2013.01); *H01L 23/49822* (2013.01); *H01L 23/66* (2013.01); *H01L 24/16* (2013.01); *H01L 2223/6677* (2013.01); *H01L 2224/16227* (2013.01)

(58) Field of Classification Search
CPC . H01L 25/072; H01L 23/3121; H01L 23/481; H01L 23/49822; H01L 23/66; H01L 24/16; H01L 2223/6677; H01L 2224/16227; H01L 2224/0401; H01L 2224/05647; H01L 2224/13147; H01L 2224/94; H01L 2223/6627; H01L 23/49811; H01L 2924/15313; H01L 23/145; H01L 23/5383; H01L 23/15; H01L 23/5387; H01L 2224/97; H01L 23/49816; H01L 23/49827; H01L 23/49838; H01L 23/49844; H01Q 9/0407; H01Q 21/065; H01Q 1/2283; H01Q 1/22; H01Q 1/36; H01Q 1/48; H01Q 1/50; H10K 77/10
See application file for complete search history.

(56) References Cited

U.S. PATENT DOCUMENTS

2012/0113341 A1* 5/2012 Uochi ................... H01L 29/93
257/43
2019/0287938 A1* 9/2019 Kim ........................ H01L 24/19

* cited by examiner

*Primary Examiner* — Elias Ullah
(74) *Attorney, Agent, or Firm* — Winston Hsu

(57) ABSTRACT

An electronic device includes a carrier, a plurality of electronic elements and a connecting terminal. The carrier has at least one bonding pad. The electronic elements are disposed on the carrier, and each of the electronic elements includes a substrate. A distance between two adjacent substrates of the electronic elements is not less than 300 μm. The connecting terminal is disposed between one of the substrate and the carrier. One of the electronic elements are electrically connected to the at least one bonding pad via the connecting terminal.

20 Claims, 11 Drawing Sheets

(51) Int. Cl.
*H01L 23/48* (2006.01)
*H01L 23/498* (2006.01)
*H01L 23/66* (2006.01)
*H01L 25/07* (2006.01)

ELECTRONIC DEVICE

CROSS REFERENCE TO RELATED APPLICATIONS

This application is a continuation application of U.S. application Ser. No. 17/106,197, filed on Nov. 30, 2020. The content of the application is incorporated herein by reference.

BACKGROUND OF THE DISCLOSURE

1. Field of the Disclosure

The present disclosure relates to an electronic device, in particular to an electronic device in which an electronic element including a substrate is arranged on a carrier.

2. Description of the Prior Art

In the manufacturing process of electronic devices, substrates of different materials may be used for manufacture in order to go with the process conditions or with the manufacturing cost. Therefore, it has to face the technical problem of combining substrates of different materials.

SUMMARY OF THE DISCLOSURE

In view of this, it is necessary to provide an electronic device in which a carrier is combined with a substrate to solve the technical problems which the current electronic devices have in the manufacture process. According to the embodiments of the present disclosure, an electronic device in which a carrier is combined with a substrate may be provided, for example, a glass substrate of better heat resistance is combined with a carrier of a lower cost, thereby achieving a better advantage of a material combination.

An electronic device disclosed in the present disclosure includes a carrier, a plurality of electronic elements and at least one connecting terminal. The carrier has at least one bonding pad. A plurality of electronic elements are disposed on the carrier. One of the plurality of electronic elements includes a substrate and a substrate through hole penetrating the substrate. At least one connecting terminal is disposed between the substrate and the carrier, and the plurality of electronic elements are electrically connected to the at least one bonding pad via the at least one connecting terminal.

An electronic device disclosed in the present disclosure includes a carrier, a plurality of electronic elements and a connecting terminal. The carrier has at least one bonding pad. The electronic elements are disposed on the carrier, and each of the electronic elements includes a substrate. A distance between two adjacent substrates of the electronic elements is not less than 300 µm. The connecting terminal is disposed between the substrate of one of the plurality of electronic elements and the carrier. One of the electronic element is electrically connected to the at least one bonding pad via the connecting terminal.

An electronic device disclosed in the present disclosure includes a carrier, an electronic element and a connecting terminal. The carrier includes at least one bonding pad and a metal layer. The metal layer includes a pattern. The electronic element is disposed on the carrier, and the electronic element includes a substrate and at least one of a varicap diode and a thin-film transistor. The connecting terminal is disposed between the substrate and the carrier. The electronic element is electrically connected to the at least one bonding pad via the connecting terminal.

These and other objectives of the present disclosure will no doubt become obvious to those of ordinary skill in the art after reading the following detailed description of the embodiment that is illustrated in the various figures and drawings.

DETAILED DESCRIPTION

Figure 1:
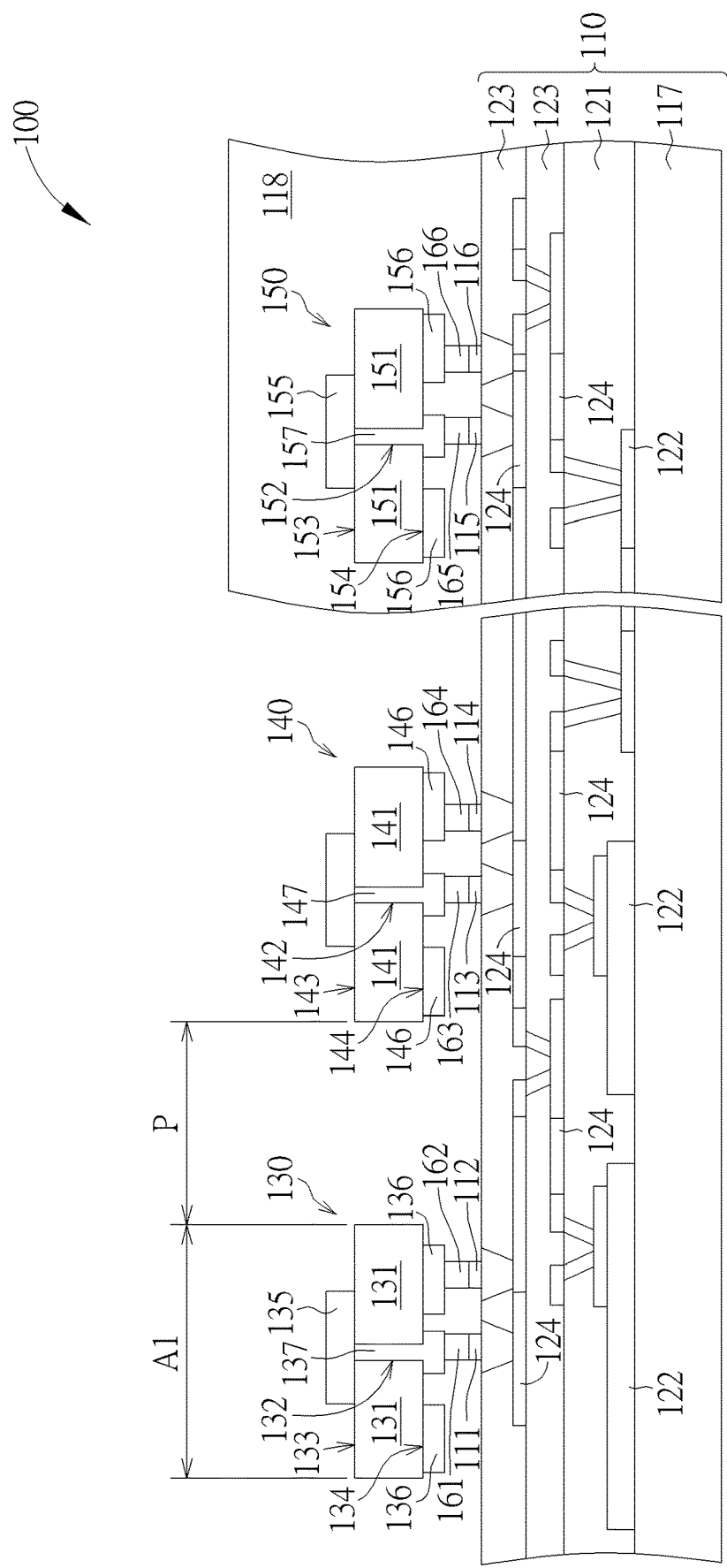
FIG. 1 is a schematic diagram of a structure of an electronic device according to some embodiments of the present disclosure, and the structures of each element are shown in a cross-sectional view.

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function. In the following description and in the claims, the terms "include", "comprise" and "have" are used in an open-ended fashion, and thus should be interpreted to mean "include, but not limited to . . . ".

The directional terms mentioned in this article, such as "below", "lower", "bottom", "on", "higher", "top", etc., only refer to the directions of the drawings. It is understandable that the elements described on the "lower" side will become elements on the "higher" side if the device in the drawing is turned upside down. In the drawings, each drawing depicts the general features of the methods, structures and/or materials used in specific embodiments. However, these drawings should not be construed as defining or limiting the scope or nature in these embodiments. For example, in terms of clarity, the relative size, thickness, and position of each layer, region, and/or structure may be reduced or enlarged. It will be understood that when an element or layer is referred to as being "on another component or on another layer" or "connected to another component or to another layer", it can be directly on or directly connected to the other element or layer, or intervening elements or layers may be presented. In contrast, when an element is referred to as being "directly on" or "directly connected to" another element or layer, there are no intervening elements or layers presented.

In some embodiments of the present disclosure, terms such as "connection", "interconnection", etc. regarding bonding and connection, unless specifically defined, may refer to two structures which are in direct contact with each other, or are not in direct contact with each other. It is possible that there are other structures located between these two structures. Moreover, terms such as "connection", "interconnection" may also include the case where both structures are movable or both structures are fixed. In addition, the term "coupled" includes any direct and indirect electrical connection means.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

In addition, according to the embodiments of the present disclosure, an optical microscopy (OM), a scanning electron microscope (SEM), a film thickness profile measuring instrument (α-step), an ellipsometer or other suitable methods may be used to measure the thickness, width or distance between components of each component. In detail, in some embodiments, after removing the liquid crystal layer, a scanning electron microscope may be used to obtain any cross-sectional image of the structure, the thickness and the width of each element, or the distance between the elements in the image to be measured.

The terms "about", "substantially", "equal", or "same" generally mean within 10% of a given value or range, or mean within 10%, 5%, 3%, 2%, 1%, or 0.5% of a given value or range. It is possible that the meanings of the terms "about", "substantially", "equal", or "same" may be implied in the absence of explicit indications. The term "in a range between A and B" refers to a scope in which A value, other values between A and B, and B value are inclusive.

It should be noted that the technical features in different embodiments described in the following can be replaced, recombined, or mixed with one another to constitute another embodiment without departing from the spirit of the present disclosure.

FIG. 1 is a schematic diagram of a structure of an electronic device according to some embodiments of the present disclosure, and the structures of each element are shown in a cross-sectional view. The electronic device 100 of some embodiments of the present disclosure includes a carrier 110, a plurality of electronic elements and at least one connecting terminal. The electronic device may include a display device, an antenna device, a sensing device or a tiled device, but the present disclosure is not limited thereto. The electronic device may include a bendable electronic device or a flexible electronic device. The electronic device may, for example, include a liquid crystal or a light emitting diode; the light emitting diode may, for example, include an organic light emitting diode (OLED), a sub-millimeter light emitting diode (mini LED), a micro light emitting diode (micro LED) or a quantum dot (QD) light emitting diode (for example, QLED or QDLED), fluorescence, phosphor or other suitable materials, and the materials may be optionally combined, but the present disclosure is not limited thereto. The antenna device may be, for example, a liquid crystal antenna, but the present disclosure is not limited thereto. The tiled device may be, for example, a display tiled device or an antenna tiled device, but the present disclosure is not limited thereto. It should be noted that the electronic device may be the optional combination of the above, but the present disclosure is not limited thereto. Hereinafter, the antenna device is used as an electronic device to describe the present disclosure, but the present disclosure is not limited thereto.

The carrier 110 may include a transparent or opaque organic material or inorganic material, and may also include a rigid material or a flexible material. The organic material may include, for example, polyimide (PI), polycarbonate (PC), polyethylene terephthalate (PET), liquid crystal polymer (LCP), other known suitable materials or a combination of the above, but the present disclosure is not limited thereto. The inorganic material may include a dielectric material or a metal material, but the present disclosure is not limited thereto. The rigid material may be, for example, glass, quartz, sapphire, ceramic or plastic, or any suitable material. The term "flexible material" here refers to a material which may be curved, bent, folded, rolled, flexible, stretched and/or other similar deformations to represent at least one of the above-mentioned possible deformations. An example of flexible materials may include one of the above-mentioned organic materials, but the flexible materials referred to in this disclosure are not limited to the materials mentioned, and "flexibility" is not limited to the above-mentioned deformation methods. The carrier 110 may include at least one bonding pad, such as one or more bonding pad 111, bonding pad 112, bonding pad 113, bonding pad 114, bonding pad 115 and bonding pad 116. The carrier 110 may include a supporting layer 117. The supporting layer 117 may include a transparent or non-transparent organic material or inorganic material, and may also include a rigid material or a flexible material to support other elements of the carrier 110. The area of the supporting layer 117 of the carrier 110 may represent the area of the carrier. The bonding pad may include a conductive material, such as copper, but the present disclosure is not limited thereto. Optionally, the carrier 110 may include various elements for use in electronic devices, such as a dielectric layer 121, a metal layer 122, a redistribution layer (RDL) 123, an array of electronic elements, such as a matrix antenna, but the present disclosure is not limited thereto. The redistribution layer (RDL) 123 may be a multi-layer structure, including wires 124, electrical connection structures, insulating layers, vias etc. but the present disclosure is not limited thereto. When the electronic device 100 is applied as a display device, the carrier 110 may also include a switching element and/or a driving element (not shown) (for example, including a semiconductor layer, a source and a drain), a common electrode (not shown), a pixel defining layer (not shown) or a limitation layer (not shown) . . . etc., but the film layers and electronic elements included in the carrier 110 of the present disclosure are not limited to the above. The redistribution layer 123 is beneficial to form a fan-out panel level package (FoPLP). The metal layer 122, the redistribution layer 123 or the wires 124 in the carrier 110 may be interconnected with each other to be advantageous in wiring design.

FIG. 1 shows the electronic element 130, the electronic element 140 and the electronic element 150, and the adjacent electronic element 130 and electronic element 140 represent an electronic element array, but the present disclosure is not limited thereto. The electronic element 130, the electronic element 140 and the electronic element 150 may be disposed on the carrier 110 and electrically connected to the carrier 110, respectively. The electronic element 130, the electronic element 140, and the electronic element 150 may be electronic elements of the same function or of different functions, respectively.

The electronic element 130 may include a substrate 131 and a substrate through hole 132 penetrating the substrate 131. The substrate 131 may include a first side 133 and a second side 134 opposite to the first side 133. The second side 134 of the substrate 131 may be closer to the carrier 110 than the first side 133 is, for example, the second side 134 may face the carrier 110. The electronic element 140 may include a substrate 141 and a substrate through hole 142 penetrating the substrate 141. The substrate 141 may include a first side 143 and a second side 144 opposite to the first side 143. The second side 144 of the substrate 141 may be closer to the carrier 110 than the first side 143 is, for example, the second side 144 may face the carrier 110. The electronic element 150 may include a substrate 151 and a substrate through hole 152 penetrating the substrate 151. The substrate 151 may include a first side 153 and a second side 154 opposite to the first side 153. The second side 154 of the substrate 151 may be closer to the carrier 110 than the first side 153 is, for example, the second side 154 may face the carrier 110. The substrate 131, the substrate 141 or the substrate 151 may respectively (but not limited to) include an inorganic material. Each substrate in the plurality of electronic elements may respectively have a substrate area A1. In some embodiments, the total substrate area of the substrates of all the electronic elements on the carrier 110 is smaller than the area of the carrier 110, but the present disclosure is not limited thereto. The total area of the substrates smaller than the area of the carrier 110 may be beneficial to reduce the cost. In some embodiments, the substrate 131, the substrate 141 or the substrate 151 may include a rigid material, such as glass or quartz, but the present disclosure is not limited thereto. The minimum gap P between the substrates of two adjacent electronic elements may not be less than 300 μm (micrometer), that is, minimum gap P≥300 μm, but the present disclosure is not limited to this.

The electronic device 100 includes at least one connecting terminal, such as one or more connecting terminal 161, connecting terminal 162, connecting terminal 163, connecting terminal 164, connecting terminal 165 and connecting terminal 166 to be respectively disposed between the substrate 131 and the carrier 110, between the substrate 141 and the carrier 110 and between the substrate 151 and the carrier 110. The connecting terminal may include a conductive material, such as copper, but the present disclosure is not limited thereto. A connecting terminal and a bonding pad may have a one-to-one relationship, but the present disclosure is not limited to this. For example, the connecting terminal 161 may be electrically connected to or in direct contact with the bonding pad 111, the connecting terminal 162 may be electrically connected to or in direct contact with the bonding pad 112, the connecting terminal 163 may be electrically connected to or indirect contact with the bonding pad 113, the connecting terminal 164 may be electrically to or in direct contact with the bonding pad 114, the connecting terminal 165 may be electrically connected to or in direct contact with the bonding pad 115, and the connecting terminal 166 may be electrically connected to or in direct contact with the bonding pad 116, but the present disclosure is not limited thereto.

One or more electronic elements may be electrically connected to at least one bonding pad via at least one connecting terminal. In some embodiments, the electronic element and the connecting terminal may have a one-to-one relationship. For example, the electronic element 130 may be electrically connected to the connecting terminal 161, and the electronic element 130 may be electrically connected to the connecting terminal 162, but the present disclosure is not limited thereto. The electronic element 140 may be electrically connected to the connecting terminal 163, and the electronic element 140 may be electrically connected to the connecting terminal 164, but the present disclosure is not limited thereto. The electronic element 150 may be electrically connected to the connecting terminal 165, and the electronic element 150 may be electrically connected to the connecting terminal 166, but the present disclosure is not limited thereto. In some embodiments, the association of the electronic element with the connecting terminal may also be multiple electronic elements sharing a connecting terminal (not shown), but the present disclosure is not limited to this.

In some embodiments, the electronic element 130 may include a thin-film transistor or an antenna element, etc., but the present disclosure is not limited thereto. If the electronic element 130 is an antenna component, the electronic element 130 may further include a signal terminal 135, a ground terminal 136 and a conductive connection portion 137. The signal terminal 135, the ground terminal 136 and the conductive connection portion 137 may respectively include a conductive material, such as copper, but the present disclosure is not limited thereto. In some embodiments, the signal terminal 135 may be disposed on the first side 133 of the substrate 131 for transmitting signals and/or receiving signals. In some embodiments, the ground terminal 136 may be disposed on the second side 134 of the substrate 131, and the ground terminal 136 may be disposed between the substrate 131 and the carrier 110. The ground terminal 136 may be electrically connected to at least one connecting terminal, for example, electrically connected to the connecting terminal 162 and electrically connected to the carrier 110 via the connecting terminal 162, but the present disclosure is not limited thereto. In some embodiments, the conductive connection portion 137 may be at least partially filled inside the substrate through hole 132 and partially disposed in the substrate through hole 132. Apart of the conductive connection portion 137 may be disposed on the second side 134 of the substrate 131, that is, a part of the conductive connection portion 137 may be disposed between the substrate 131 and the carrier 110. The conductive connection portion 137 may be in a form of a T shape (or may be called an inverted T-shape, as shown in FIG. 1), but the present disclosure is not limited thereto. In some embodiments, the conductive connection portion 137 may be electrically connected to the signal terminal 135 and to at least one connecting terminal, for example, electrically connected to the connecting terminal 161, but the present disclosure is not limited thereto, so that the signal terminal 135 may be electrically connected to the carrier 110.

In some embodiments, the electronic element 140 may include a thin-film transistor or an antenna element, etc., but the present disclosure is not limited thereto. If the electronic element 140 includes a thin-film transistor, the electronic element 140 may further include (but not limited to) a data line (not shown), a gate line (not shown), and a bonding pad 146, a bonding pads 147, other wires or electronic elements (such as a capacitor, a reset component, a compensation component, a control component, etc., not shown), but the present disclosure is not limited thereto. In some embodiments, the electronic element 140 may be used as a switching component to control the signal terminal 135 of the electronic element 130 serving as an antenna component via the electrical connection to the carrier 110, but the present disclosure is not limited to this. For example, the thin-film transistor may be a bottom gate transistor, including a gate (for example, a part of a gate line), a source (not shown) (for example, a part of a data line), a drain (not shown), a semiconductor layer (not shown) as a channel, and a dielectric layer serving as a gate insulating layer (not shown). A dielectric layer or a protective layer may be selectively provided on the source electrode and on the drain electrode. The dielectric layer and the protective layer may be an inorganic material or an organic material, respectively. The bonding pad 146 of the thin-film transistor or the bonding pad 147 filled in the substrate through hole 142 may be electrically connected to the bonding pad 113 or to the bonding pad 114 of the carrier 110 via the connecting terminal 163 or via the connecting terminal 164, respectively. Therefore, the electronic element 140 may be electrically connected to the carrier 110 to control the electronic element 130 serving as an antenna element. The source, the drain, the gate, the data line and the gate line may be made of a conductive material, such as a metal, for example aluminum (Al), copper (Cu), titanium (Ti), molybdenum (Mo), or suitable materials or a combination thereof, but not limited to this. The thin-film transistor 131 may also be a top gate transistor, but is not limited to this.

In some embodiments, the electronic element 150 may be an antenna component or a thin-film transistor, etc., but the present disclosure is not limited thereto. If the electronic element 150 is an antenna component, the electronic element 150 may further include a signal terminal 155, a ground terminal 156 and a conductive connection portion 157. Please refer to the electronic element 130 as described above for the description of the electronic element 150 used as an antenna component so the details are not elaborated again. In some embodiments, the electronic device 100 may further include an encapsulating material to cover at least one of the plurality of electronic elements and the switching components to reduce the damage of moisture or of oxygen to the electronic elements. For example, FIG. 1 shows that the electronic device 100 of some embodiments of the present disclosure includes the encapsulating material 118 to cover the electronic element 150, but the present disclosure is not limited thereto.

The electronic device 100 of some embodiments disclosed in the present disclosure may first fabricate elements on a bulk substrate, and form independent electronic elements on small-sized chip substrates after appropriate cutting steps, the substrate and the carrier 110 are assembled to form the electronic device 100 after an alignment step. The manufacturing process of the electronic device 100 is briefly described in the following, but the present disclosure is not limited thereto.

Figure 2:
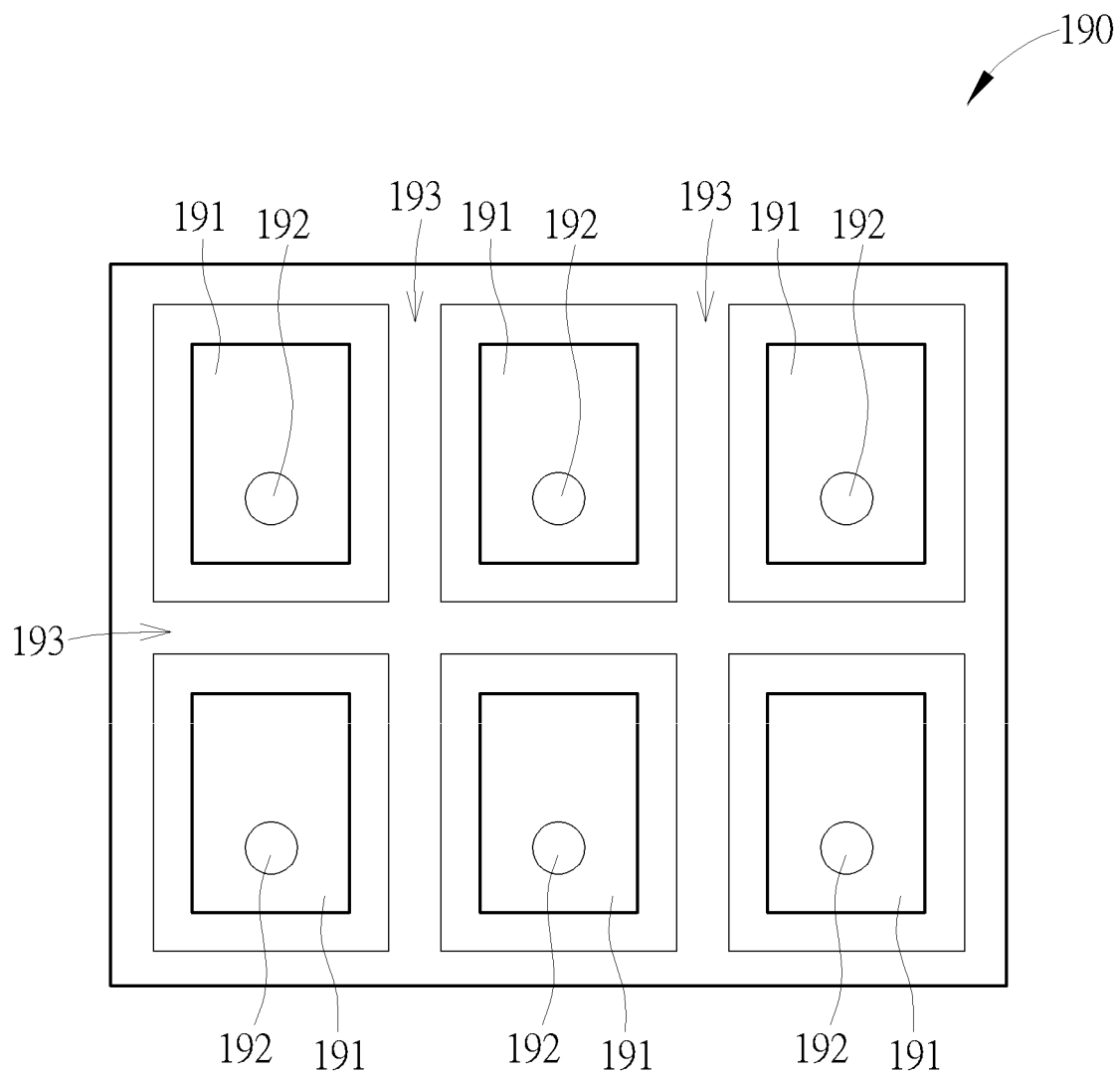
FIG. 2 is a schematic diagram of a top view of the electronic device in a manufacturing process stage.
Figure 3:
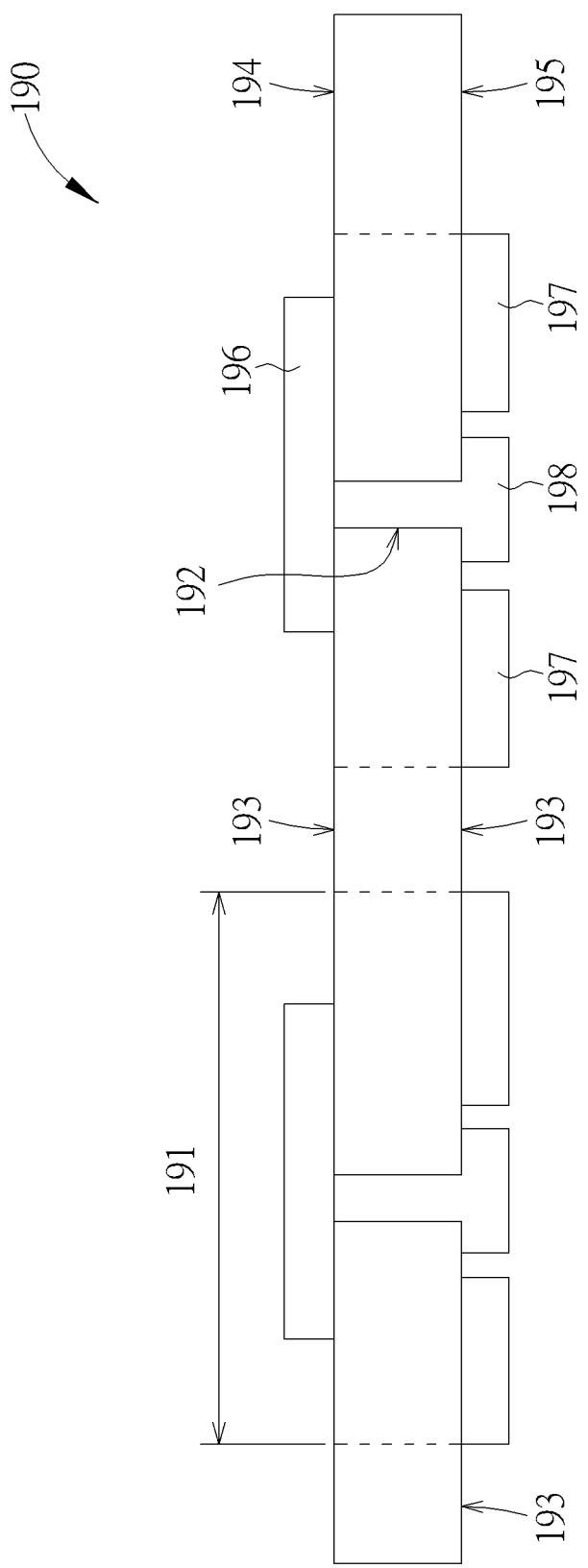
FIG. 3 is a schematic diagram of a cross-sectional view corresponding to FIG. 2.

FIG. 2 to FIG. 6 are schematic flow diagrams of methods of manufacturing the electronic device according to some embodiments of the present disclosure. FIG. 2 is a schematic diagram of a top view of the electronic device in a manufacturing process stage, and FIG. 3 is a schematic diagram of a cross-sectional view corresponding to FIG. 2. First, as shown in FIG. 2, a substrate 190 is provided. The substrate 190 may be a bulk, uncut and rigid substrate material. A rigid substrate material is beneficial to safely pass some high-temperature processes required by certain devices. For example, the process temperature may be as high as 250° C. or above. The process temperature of some embodiments of the present disclosure may be 250° C. to 400° C., but the present disclosure is not limited thereto. Suitable rigid substrate materials, for example, may include glass, quartz or a combination thereof, but the present disclosure is not limited thereto. A bulk substrate 190 may include an element region 191, a substrate through hole 192 and a cutting region 193. The maximal width of the element regions 191 may be in a range between 5 mm (millimeter) and 200 mm, and the minimal width of the cutting region 193 may be smaller than the minimal gap P between the substrates of two adjacent electronic elements, such as the minimal width of the cutting region 193 may be in a range between 50 μm and 300 μm, for example, about 100 μm, but the present disclosure is not limited thereto. The bulk substrate 190 may have undergone some high-temperature manufacturing processes to form some elements, such as antenna elements. For example, the bulk substrate 190 may include a first side 194, a second side 195 opposite to the first side 194, a signal terminal 196, a ground terminal 197, and a conductive connection portion 198. In some embodiments, the bulk substrate 190 may have undergone some high-temperature processes to form some components, such as thin-film transistor switching components or PIN diode components, but the present disclosure is not limited thereto. Please refer to the above description for the details of the thin-film transistor component, so the details are not elaborated again.

Figure 4:
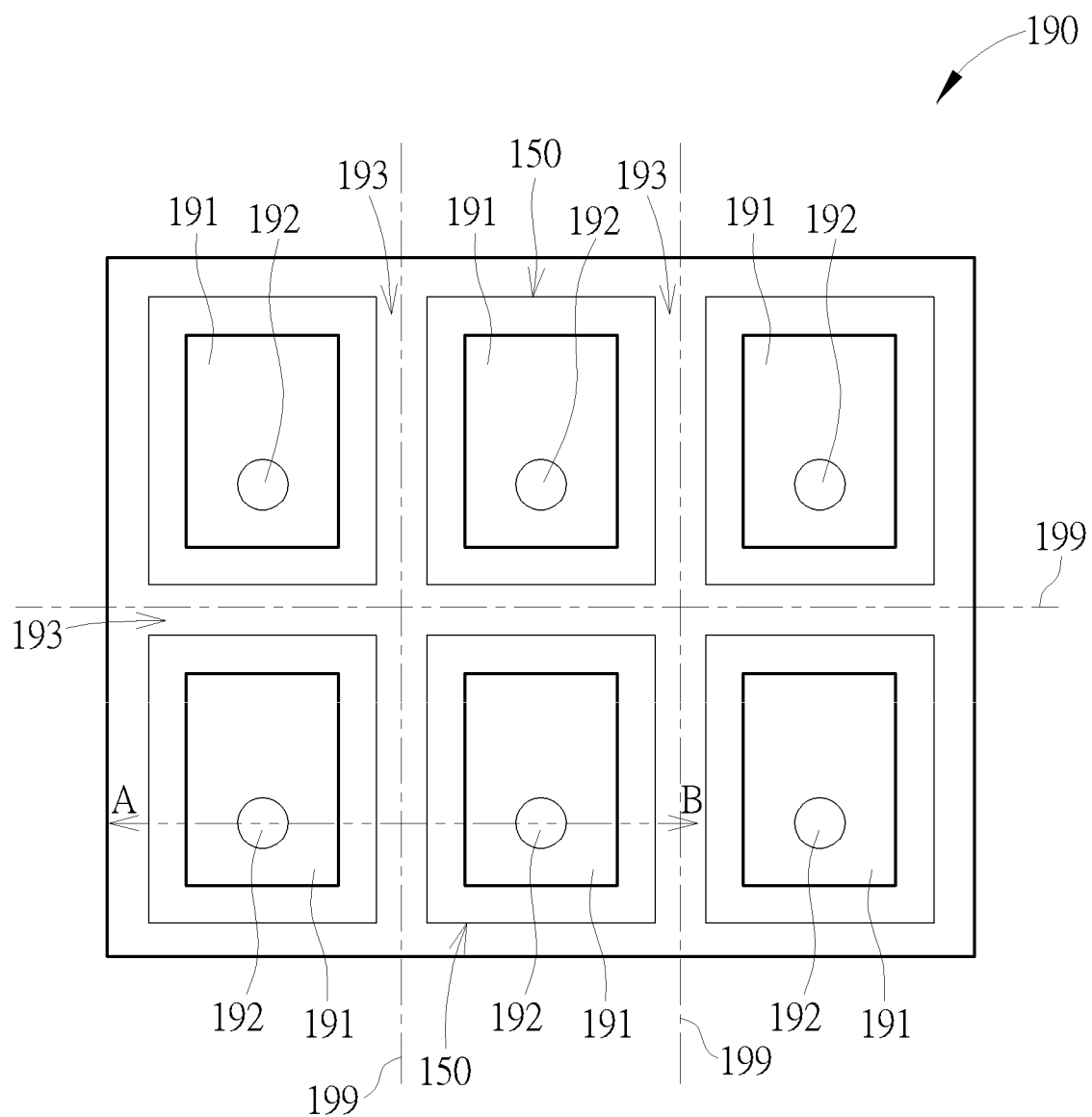
FIG. 4 is a schematic diagram of a top view of an electronic device in a manufacturing process stage.
Figure 5:
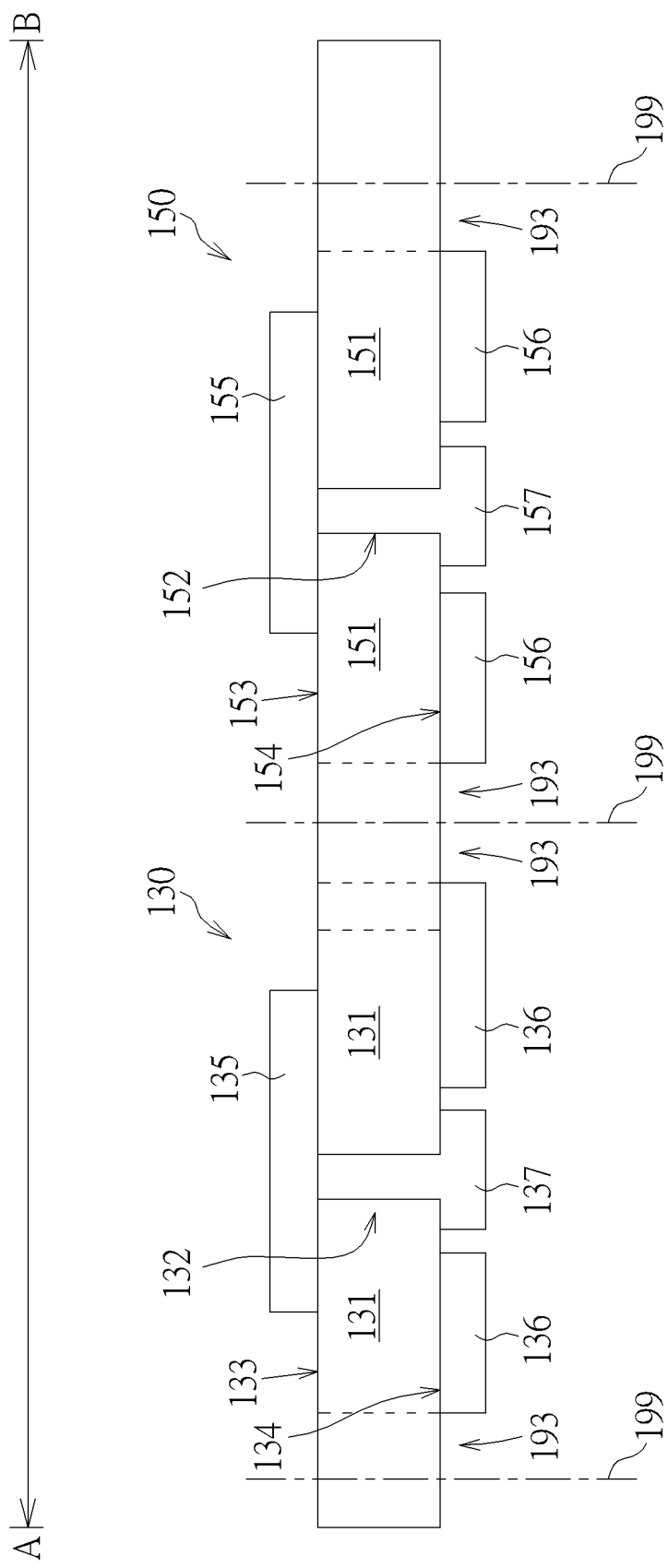
FIG. 5 is a schematic diagram of a cross-sectional view corresponding to FIG. 4.

FIG. 4 is a schematic diagram of a top view of an electronic device in a manufacturing process stage, and FIG. 5 is a schematic diagram of a cross-sectional view corresponding to the line A-B in FIG. 4. Second, as shown in FIG. 4, the substrate 190 may be appropriately cut along the cutting lines 199 in the cutting regions 193. After the substrate 190 undergoes an appropriate cutting process, a plurality of small-sized chip substrates may be obtained to form electronic elements, such as the electronic element 130, the electronic element 140 and the electronic element 150. At this time, the small-sized chip substrates may be regarded as the substrate in the electronic elements as shown in FIG. 1. The electronic element 130 and the electronic element 150 may include a chip substrate. For example, the chip substrate may be the substrate 131 of the electronic element 130 or the substrate 151 of the electronic element 150, but the present disclosure is not limited thereto. The electronic element 130 or the substrate 151 of the electronic element 150 may include the cutting region 193 and cutting line 199 or not include the cutting region 193 and cutting line 199. FIG. 5 shows that the electronic element 130 or the electronic element 150 may include the cutting region 193 and cutting line 199, and FIG. 1 shows that the electronic element 130 or the electronic element 150 may not include the cutting region 193 and cutting line 199.

Figure 6:
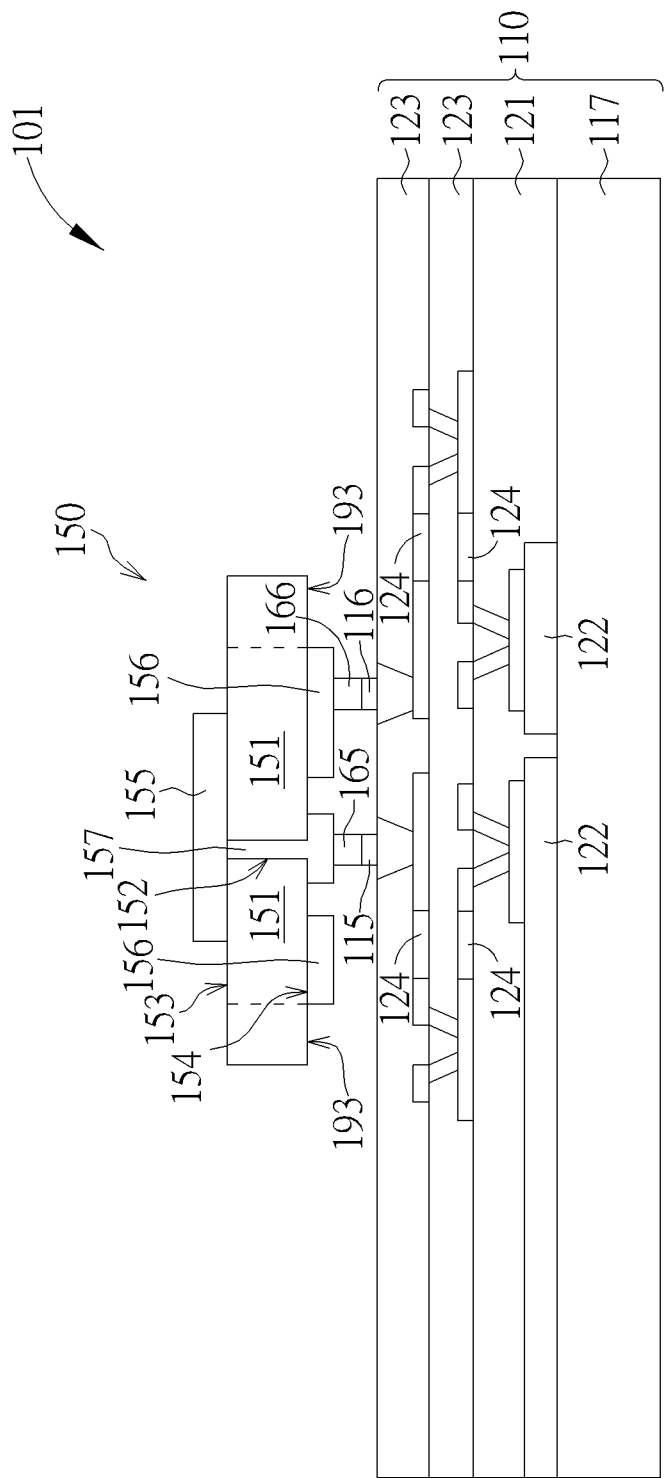
FIG. 6 is a schematic diagram of a structure of an electronic device according to some embodiments of the present disclosure, and the structures of each element are shown in a cross-sectional view.

FIG. 6 is a schematic diagram of a structure of an electronic device according to some embodiments of the present disclosure, and the structures of each element are shown in a cross-sectional view. FIG. 6 also shows a schematic diagram of the electronic device in the manufacturing process stage in a cross-sectional view. According to the present disclosure, a carrier 110, for example, a bulk carrier 110 may be provided. Please refer to the above description for the details of the carrier 110, so the details are not elaborated again. The carrier 110 may have undergone a low temperature process or include a low-resolution pattern. For example, the carrier 110 may include at least one bonding pad, such as one or more bonding pad 111 and bonding pad 112. The electronic element 150 or the carrier 110 may be provided with at least one connecting terminal, for example, one or more connecting terminal 161 and connecting terminal 162. The connecting terminal 161 may be electrically connected to or in direct contact with the bonding pad 111, and the connecting terminal 162 may be electrically connected to or indirect contact with the bonding pad 112. Then, the electronic element 150 may be bonded to the carrier 110. The ground terminal 136 of the electronic element 150 may be electrically connected to at least one connecting terminal, such as electrically connected to the connecting terminal 162, but the present disclosure is not limited thereto. The conductive connection portion 157 of the electronic element 150 may be electrically connected to the signal terminal 155 and to at least one connecting terminal, for example, electrically connected to the connecting terminal 161, but the present disclosure is not limited thereto, so that the signal terminal 155 may be electrically connected to the carrier 110. Thus, at least one bonding pad of the carrier 110 may be electrically connected to the electronic element 150 via at least one connecting terminal to obtain the electronic device 101 or the electronic device 100. FIG. 1 shows that the electronic element 130 or the electronic element 150 of some embodiments of the present disclosure may not include the cutting region 193, and FIG. 6 shows that the electronic element 150 of some embodiments of the present disclosure may include the cutting region 193 and cutting line 199, and the electronic element 150 may be an antenna element or a thin-film transistor.

Figure 7:
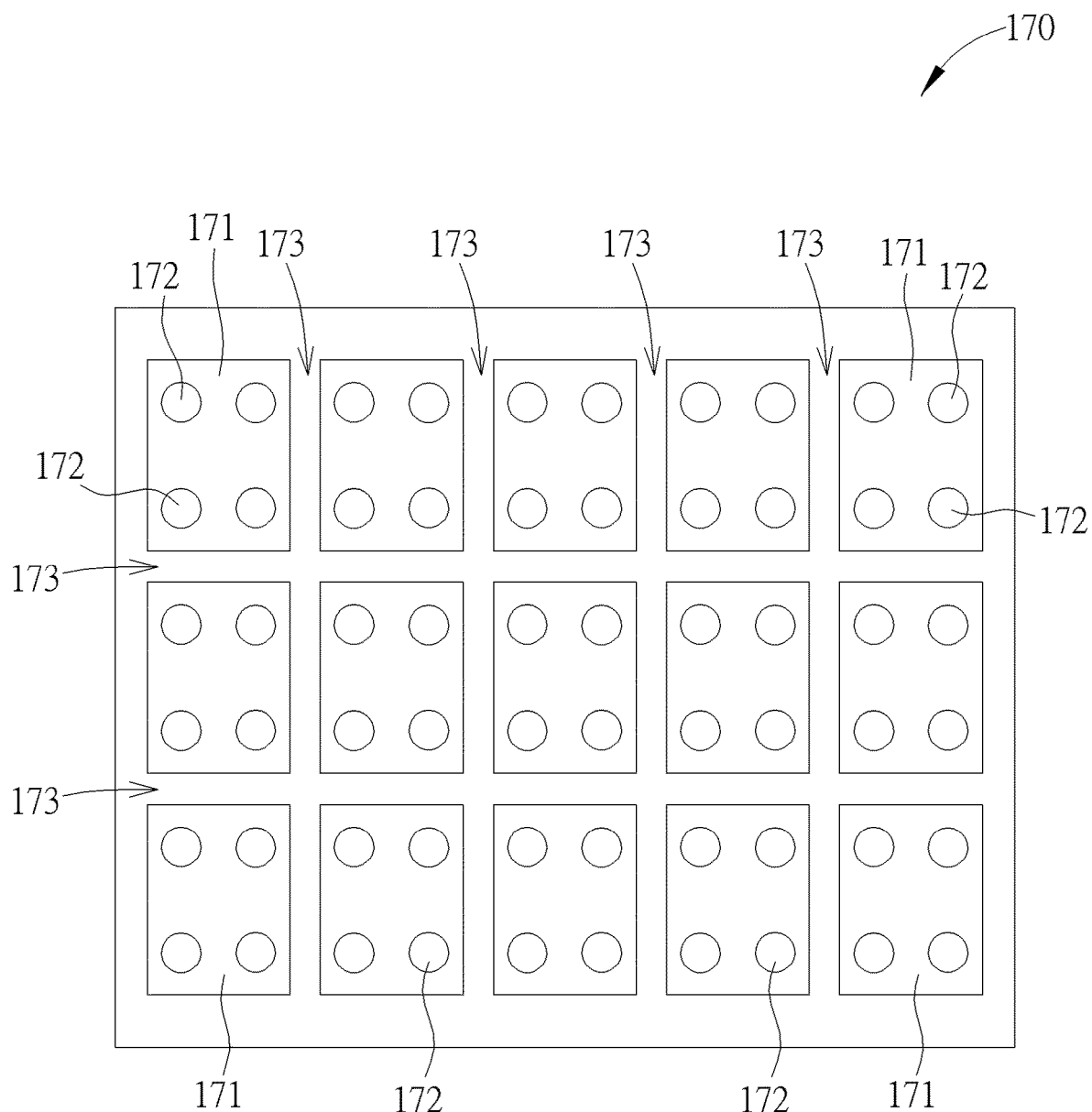
FIG. 7 is a schematic diagram of a top view of an electronic device in a manufacturing process stage.
Figure 8:
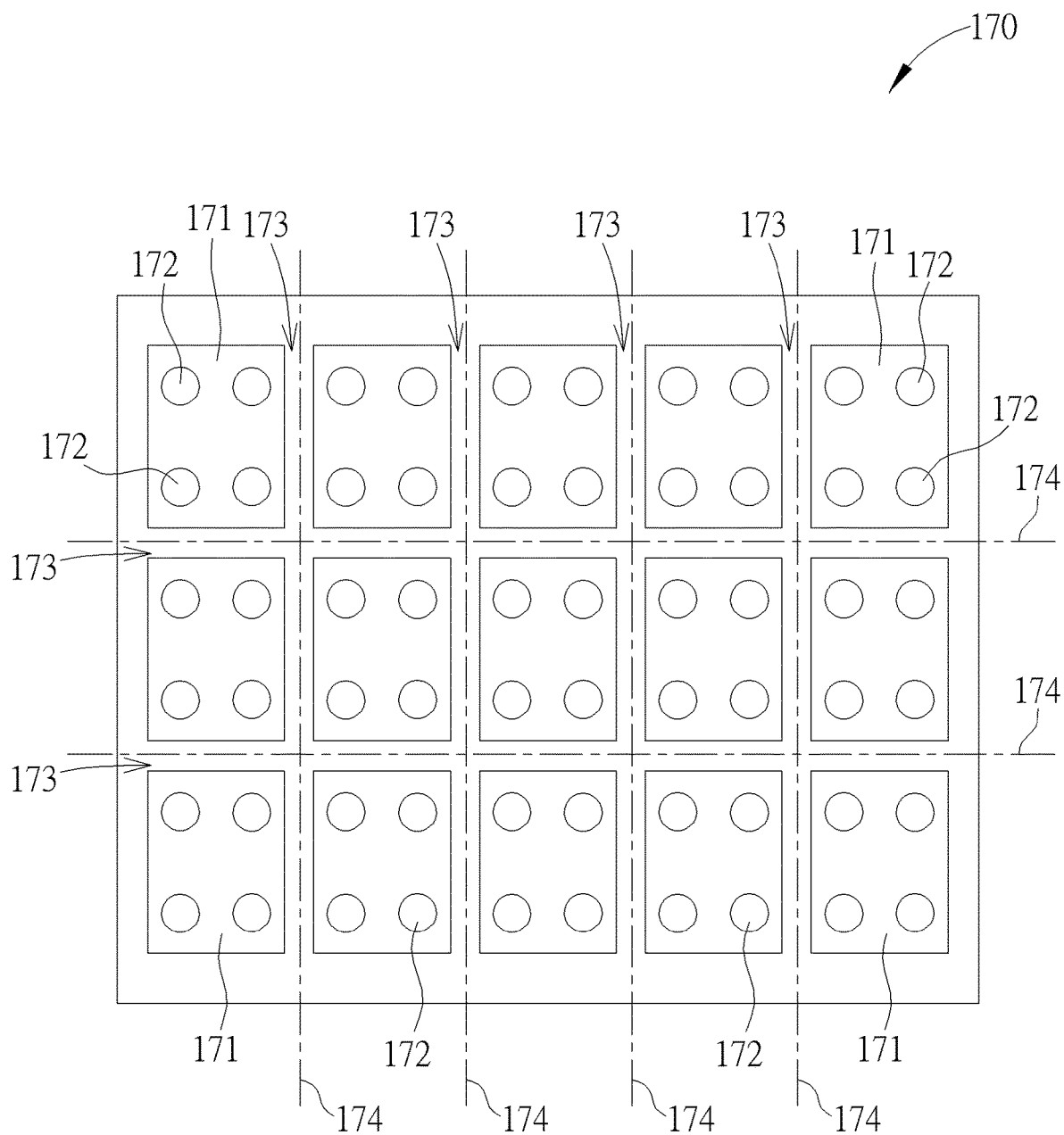
FIG. 8 is a schematic diagram of a top view corresponding to FIG. 7.

FIGS. 7 to 8 are schematic flowcharts of another method of manufacturing an electronic device according to the present disclosure. FIG. 7 is a schematic diagram of a top view of an electronic device in a manufacturing process stage, and FIG. 8 is a schematic diagram of a top view corresponding to FIG. 7. First, as shown in FIG. 7, a substrate 170 is provided. The substrate 170 may be an uncut, bulk and rigid substrate material. A rigid substrate material is beneficial to undergo some high-temperature manufacturing processes required by special elements. For example, the process temperature may be as high as 250° C. or above when manufacturing thin-film transistors. The process temperature of some embodiments disclosed in this disclosure may be 250° C. to 400° C., but the present disclosure is not limited to this. A suitable rigid substrate material, for example, may include glass, quartz or a combination thereof, but the present disclosure is not limited thereto. The bulk substrate 170 may include an element region 171, an optional substrate through hole 172 and a cutting region 173. The maximal width of the element region 171 may be in a range between 0.3 mm and 60 mm, and the minimal width of the cutting region 173 may be smaller than the minimal gap P between the substrates of two adjacent electronic elements, for example the minimal width of the cutting region 173 may be in a range between 50 μm and 300 μm. The bulk substrate 170 may have undergone some high-temperature manufacturing processes to form some elements. For example, the element region 171 may include a thin-film transistor component, a PIN diode component or an antenna component. Please refer to the above description for the details of the thin-film transistor component or the antenna component, so the details are not elaborated again.

Figure 9:
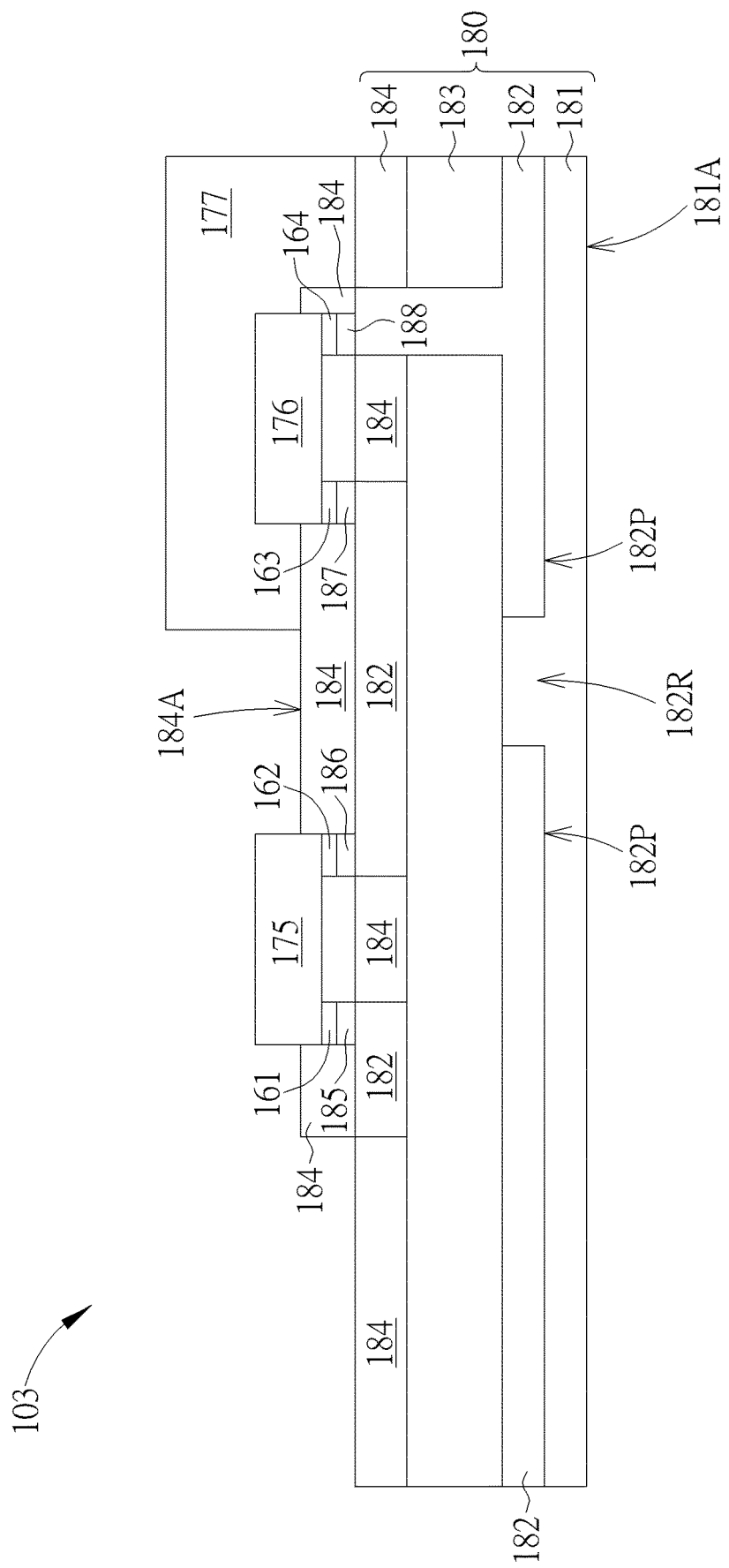
FIG. 9 is a schematic diagram of a structure of an electronic device according to some embodiments of the present disclosure, and the structures of each element are shown in a cross-sectional view.

Next, as shown in FIG. 8, the substrate 170 is appropriately cut along the cutting lines 174 in the cutting regions 173. After the substrate 170 undergoes a suitable cutting process, a plurality of chip substrates may be obtained to form electronic elements, such as an electronic element 175 or an electronic element 176. FIG. 9 is a schematic diagram of a structure of an electronic device according to some embodiments of the present disclosure, and the structures of each element are shown in a cross-sectional view. The electronic element 175 or the electronic element 176 may include the aforementioned chip substrates, but the present disclosure is not limited thereto. The electronic element 175 may include a thin-film transistor element, and the electronic element 176 may include an antenna element, but the present disclosure is not limited thereto. The electronic element 175 or the electronic element 176 may include the cutting region 173 or not include the cutting region 173. The electronic element 175 or the electronic element 176 may include the substrate through holes or not include the substrate through hole.

Then, as shown in FIG. 9, a carrier, for example, a bulk carrier 180 may be provided. Then, the electronic element 175 or the electronic element 176 may be bonded to the carrier 180. The carrier 180 may include a structure of a transparent or non-transparent organic material, inorganic material, conductive material, rigid material, or flexible material. The organic material may include, for example, polyimide, polycarbonate, polyethylene terephthalate, liquid crystal polymer, other known suitable materials, or a combination thereof, but the present disclosure is not limited thereto. The rigid material may be, for example, glass, quartz, sapphire, ceramic or plastic, or any suitable material, but the present disclosure is not limited thereto. The conductive material may be copper, but the present disclosure is not limited to this. The "flexible material" here refers to a material which may be curved, bent, folded, rolled, flexible, stretched and/or other similar deformations, to indicate at least one of the possible deformation method described above, but the present disclosure is not limited thereto. In some embodiments, the material of the substrate 170 and the material of the carrier 180 may be different.

The carrier 180 may include a stacking structure, for example, may include a first protective layer 181, a metal layer 182, a dielectric layer 183, a second protective layer 184 and at least one bonding pad. For example, one or more bonding pad 185, bonding pad 186, bonding pad 187 and bonding pad 188. The bonding pad may include a conductive material, such as copper, but the present disclosure is not limited thereto. The first protective layer 181 or the second protective layer 184 may be the outermost layer of the stacking structure, and may respectively include an insulating material to appropriately protect the remaining layers in the carrier 180, such as the metal layer 182 and the dielectric layer 183, but the present disclosure is not limited thereto. The stacking structure may include a first side and a second side opposite to the first side, for example, the first side 181A of the first protective layer 181 and the second side 184A of the second protective layer 184. The dielectric layer 183 may be a supporting structure of the carrier 180 to support other elements of the carrier 180. The metal layer 182 may be closer to the first side 181A and formed on the dielectric layer 183, and may include a conductive material, such as copper, but the present disclosure is not limited thereto. In some embodiments, the metal layer 182 may have a pattern 182P so that the pattern includes at least one notch 182R. The notch 182R may be adjacent to the first side 181A, or may be disposed on the first side 181A of the carrier 180, and may be disposed between two sets of adjacent bonding pads, for example, between the adjacent bonding pad 185/bonding pad 186 and the bonding pad 187/bonding pad 188, but the present disclosure is not limited thereto. The notch 182R may facilitate the antenna element to adjust the wavefront direction of an electromagnetic wave to make it directional. The carrier 110 may have undergone a low temperature process or include a low-resolution pattern. For example, the pattern 182P and the at least one notch 182R may be the low-resolution pattern.

The electronic element 175 or the electronic element 176, or on the carrier 180 may be provided with at least one connecting terminal, for example, one or more connecting terminal 161, connecting terminal 162, connecting terminal 163 and connecting terminal 164. The connecting terminals may include a conductive material, such as copper, but the present disclosure is not limited thereto. A connecting terminal and a bonding pad may have a one-to-one relationship, but the present disclosure is not limited to this. For example, the connecting terminal 161 may be electrically connected to or in direct contact with the bonding pad 185, the connecting terminal 162 may be electrically connected to or in direct contact with the bonding pad 186, the connecting terminal 163 may be electrically connected to or in direct contact with the bonding pad 187, and the connecting terminal 164 may be electrically connected to or in direct contact with the bonding pad 188.

Optionally, the carrier 180 may further include various elements, such as a redistribution layer (not shown), an array of electronic elements, a matrix antenna, etc. When the electronic device is applied as a display device, the carrier 180 may further include a switching element and/or a driver element (including a semiconductor layer, a source, a drain, not shown), a common electrode (not shown), a pixel defining layer (not shown) or a limitation layer (not shown) . . . etc., but the film layers and electronic elements included in the carrier 180 of the present disclosure are not limited to the above. The metal layer 182 or the redistribution layer in the carrier 180 may be interconnected with each other to be beneficial to the wiring design. The redistribution layer is beneficial to form a fan-out panel level package. FIG. 9 illustrates a combination of the electronic element 175 and the electronic element 176 to represent an array of the electronic elements.

Then, the electronic element 175 or the electronic element 176 may be bonded to the carrier 180. The electronic element 175 or the electronic element 176 may be disposed on the first side 181A of the carrier 180 or may be disposed on the second side 184A of the carrier 180. In some embodiments, the electronic element 175 or the electronic element 176 may be electrically connected to at least one connecting terminal, so that the connecting terminal 161 may be disposed between the substrate 170 and the carrier 180, the connecting terminal 162 may be disposed between the substrate 170 and the carrier 180, the connecting terminal 163 may be disposed between the substrate 170 and the carrier 180, and the connecting terminal 164 may be disposed between the substrate 170 and the carrier 180. For example, the electronic element 175 may be electrically connected to the connecting terminal 161 and to the connecting terminal 162, and the electronic element 176 may be electrically connected to the connecting terminal 163 and to the connecting terminal 164, but the present disclosure is not limited thereto, so that the electronic element 175 or the electronic element 176 may be electrically connected to the carrier 180 via the at least one connecting terminal. Accordingly, at least one bonding pad of the carrier 110 may be electrically connected to the electronic element 175 and/or the electronic element 176 via the at least one connecting terminal to obtain an electronic device 103 or an electronic device 104. In some embodiments of the present disclosure, the electronic element 175 and the electronic element 176 respectively include an electronic element such as a thin-film transistor, an antenna element, and a switching element, but the present disclosure is not limited thereto. FIG. 9 shows that the electronic element 175 of some embodiments of the present disclosure may include a thin-film transistor, and the electronic element 176 may include an antenna element or a varicap diode (varactor diode, variable capacitance diode). In some embodiments, the electronic element 175 may be electrically connected to the carrier 180 via the connecting terminal to be a switching element for controlling the electronic element 176 which serves as an antenna component or a varicap diode.

An electronic element may be electrically connected to at least one bonding pad via at least one connecting terminal. In some embodiments, an electronic element and a connecting terminal may have a one-to-one relationship. For example, the electronic element 130 may be electrically connected to the connecting terminal 161 and to the connecting terminal 162, but the present disclosure is not limited thereto. The electronic element 140 may be electrically connected to the connecting terminal 163 and to the connecting terminal 164, but the present disclosure is not limited thereto. The electronic element 150 may be electrically connected to the connecting terminal 165 and to the connecting terminal 166, but the present disclosure is not limited thereto. In some embodiments, the association of the electronic element with the connecting terminal may be multiple electronic elements sharing a connecting terminal (not shown), but the present disclosure is not limited thereto. In some embodiments, the electronic device 103 may further include an encapsulating material to cover at least one of the antenna element and the switching element to reduce the damage of moisture or of oxygen to the electronic elements. FIG. 9 shows that the electronic device 103 of some embodiments of the present disclosure may include a packaging material 177 to cover the electronic element 176, for example including an antenna element or a varicap diode, but the present disclosure is not limited thereto.

Figure 10:
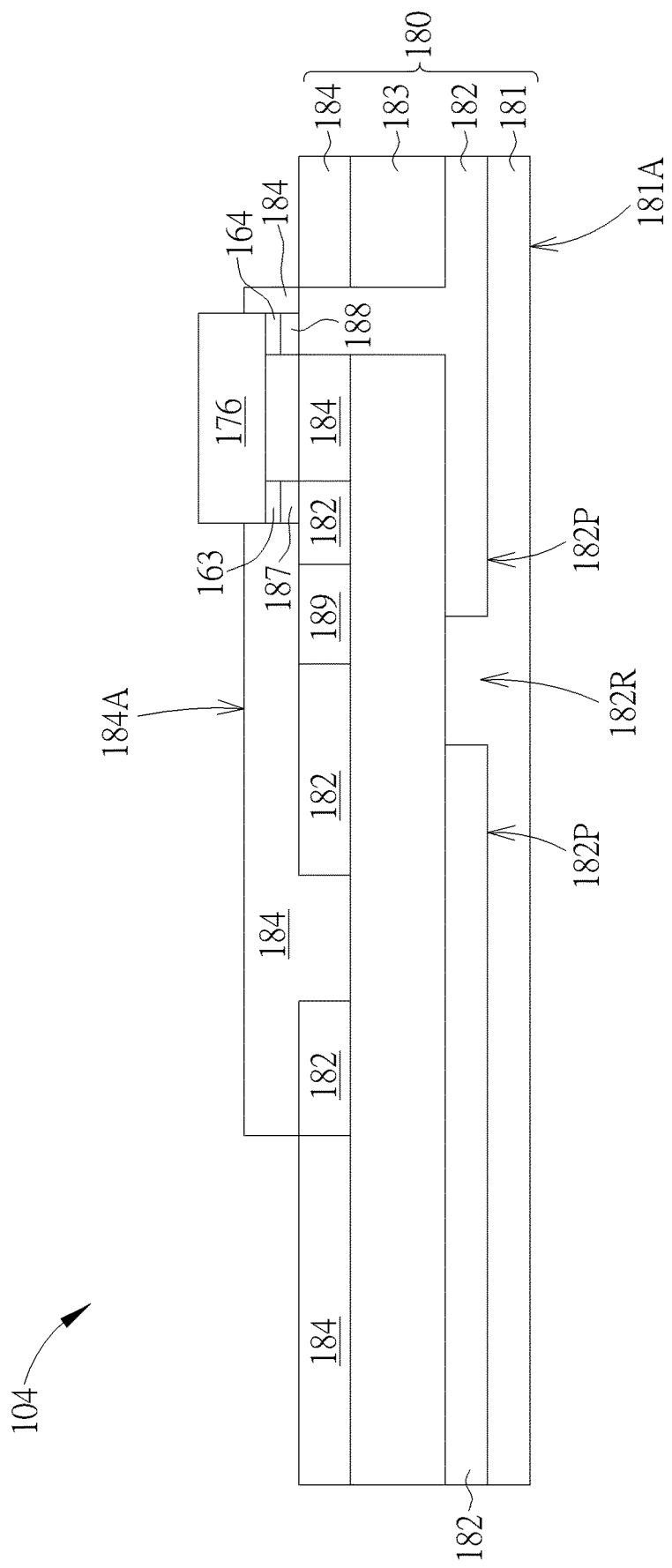
FIG. 10 is a schematic diagram of a structure of an electronic device according to some embodiments of the present disclosure, and the structures of each element are shown in a cross-sectional view.

FIG. 10 is a schematic diagram of a structure of an electronic device according to some embodiments of the present disclosure, and the structures of each element are shown in a cross-sectional view. The disclosed description of the above embodiments is not elaborated again. In some embodiments, as shown in FIG. 10, the switching element 189 may be formed in the carrier 180, and may be arranged on the second side 184A closer to the carrier 180, and the switching element 189 is directly electrically connected to the metal layer 182 without the need of the electrical connection to the carrier 180 via the connecting terminals. The switching element 189 may include a thin-film transistor, and the electronic element 176 may include an antenna element or a varicap diode. The switching element 189 may be electrically connected to the carrier 180 for use as a switching element for controlling the electronic element 176 including an antenna element or a varicap diode.

Figure 11:
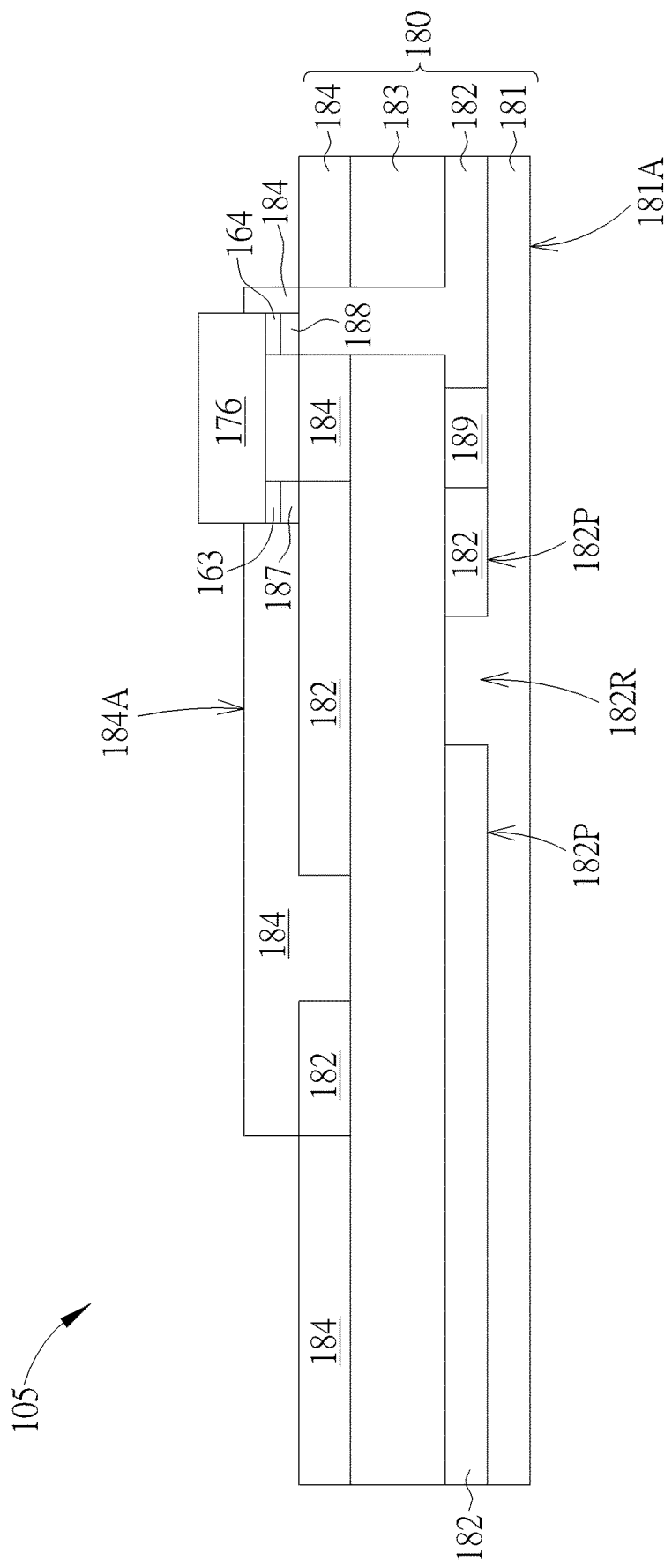
FIG. 11 is a schematic diagram of a structure of an electronic device according to some embodiments of the present disclosure, and the structures of each element are shown in a cross-sectional view.

FIG. 11 is a schematic diagram of a structure of an electronic device according to some embodiments of the present disclosure, and the structures of each element are shown in a cross-sectional view. The disclosed description of the above embodiments is not elaborated again. As shown in FIG. 11, the switching element 189 may be formed in the carrier 180, and may be disposed on the first side 181A adjacent to the carrier 180 to be directly electrically connected to the metal layer 182 without the need of the electrical connection to the carrier 180 via the connecting terminals. The switching element 189 may include a thin-film transistor, and the electronic element 176 may include an antenna element or a varicap diode. The switching element 189 may be electrically connected to the carrier 180 for use as a switching element for controlling the electronic element 176 including an antenna element or a varicap diode.

The electronic devices disclosed in the present disclosure include a material combination advantage of a carrier in association with a substrate which as better heat resistance. The carrier may be for use in a process of a low process temperature, and the substrate may be for use in manufacturing components or conditions of higher manufacturing costs, of greater complexity, or of higher process temperature. The advantage of this material combination may increase the utilization rate of the substrate without the restrictions such as material temperature, and may also solve problems such as complicated manufacturing processes, difficult manufacturing processes, or higher substrate cost. For example, when a bulk substrate is assembled with a bulk carrier, the gap P between two adjacent electronic elements becomes a non-element region which fails to correspond to the element region of the electronic elements. As the gap P between two adjacent electronic elements becomes larger, the proportion of the non-element region in the entire substrate becomes larger accordingly, and the utilization rate of the substrate which corresponding to the element region of the electronic elements decreases. However, the present disclosure provides a bulk substrate whose non-element regions, such as the cutting regions, are adjustable or reducible. The size of the cutting regions in the bulk substrate of the present disclosure may not be directly related to the gap P between two adjacent electronic elements. Therefore, it is possible to reasonably reduce or minimize the cutting regions, that is, the size of the non-element regions, in the bulk substrate of the present disclosure, thereby increasing the utilization rate of the substrate, for example of the bulk substrate of the present disclosure.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a carrier having at least one bonding pad;
a plurality of electronic elements disposed on the carrier and at least one of the plurality of electronic elements comprising a through hole, at least two of the plurality of electronic elements comprising a substrate, wherein a distance between two adjacent substrates of the at least two of the plurality of electronic elements is not less than 300 µm; and
a connecting terminal disposed between the substrate of one of the plurality of electronic elements and the carrier, wherein the one of the plurality of electronic elements is electrically connected to the at least one bonding pad via the connecting terminal,
wherein the through hole is overlapped with the at least one bonding pad and the connecting terminal.

2. The electronic device of claim 1, wherein the one of the plurality of electronic elements further comprises:
a signal terminal disposed on a first side of the substrate;
a ground terminal disposed on a second side of the substrate and between the substrate and the carrier, wherein the first side is opposite to the second side; and
a conductive connection portion at least partially disposed in a substrate through hole to electrically connect the signal terminal and the at least one connecting terminal.

3. The electronic device of claim 2, wherein the substrate through hole penetrates the substrate.

4. The electronic device of claim 1, wherein the one of the plurality of electronic elements comprises an antenna element.

5. The electronic device of claim 1, wherein another one of the plurality of electronic elements comprises a thin-film transistor.

6. The electronic device of claim 1, wherein the carrier comprises a stacking structure, the stacking structure comprises a metal layer and a dielectric layer serves as a supporting structure of the carrier.

7. The electronic device of claim 1, further comprising:
a packaging material covering at least one of the plurality of electronic elements.

8. The electronic device of claim 1, wherein the carrier comprises a redistribution layer which has a multi-layer structure.

9. The electronic device of claim 1, wherein a material of the substrates of the plurality of electronic elements is different from a material of the carrier.

10. The electronic device of claim 1, wherein a switching element is formed in the carrier.

11. The electronic device of claim 1, wherein a total area of the substrates of the plurality of electronic elements is smaller than an area of the carrier.

12. An electronic device, comprising:
a carrier comprising at least one bonding pad and a metal layer, wherein the metal layer comprises a pattern;
a first electronic element disposed on the carrier, the first electronic element comprising a substrate and at least one of a varicap diode and a thin-film transistor; and
a connecting terminal disposed between the substrate and the carrier, wherein the first electronic element is electrically connected to the at least one bonding pad via the connecting terminal.

13. The electronic device of claim 12, further comprising a second electronic element disposed on the carrier, wherein the second electronic element comprises a switching component.

14. The electronic device of claim 12, further comprising:
a packaging material covering the first electronic element.

15. The electronic device of claim 12, wherein the carrier comprises a redistribution layer which has a multi-layer structure.

16. The electronic device of claim 12, wherein a material of the substrate of the first electronic element is different from a material of the carrier.

17. The electronic device of claim 12, wherein a switching element is formed in the carrier.

18. The electronic device of claim 17, wherein the switching element comprises a thin-film transistor.

19. The electronic device of claim 12, wherein a substrate through hole penetrates the substrate.

20. The electronic device of claim 12, wherein a total area of the substrate of the first electronic element is smaller than an area of the carrier.

* * * * *